(12) United States Patent
Kajihara et al.

(10) Patent No.: US 10,312,178 B2
(45) Date of Patent: Jun. 4, 2019

(54) SEMICONDUCTOR DEVICE

(71) Applicant: Mitsubishi Electric Corporation, Tokyo (JP)

(72) Inventors: Takanobu Kajihara, Tokyo (JP); Katsuhiko Omae, Tokyo (JP); Shunsuke Fushie, Tokyo (JP); Muneaki Mukuda, Tokyo (JP); Daisuke Nakashima, Tokyo (JP); Masahiro Motooka, Tokyo (JP); Hiroyuki Miyanishi, Tokyo (JP); Yuki Nakamatsu, Tokyo (JP); Junya Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/541,507

(22) PCT Filed: Apr. 15, 2015

(86) PCT No.: PCT/JP2015/061574
§ 371 (c)(1),
(2) Date: Jul. 5, 2017

(87) PCT Pub. No.: WO2016/166835
PCT Pub. Date: Oct. 20, 2016

(65) Prior Publication Data
US 2018/0005920 A1 Jan. 4, 2018

(51) Int. Cl.
*H01L 23/433* (2006.01)
*H01L 23/29* (2006.01)
(Continued)

(52) U.S. Cl.
CPC ........ *H01L 23/4334* (2013.01); *H01L 21/565* (2013.01); *H01L 23/29* (2013.01);
(Continued)

(58) Field of Classification Search
CPC . H01L 23/49551; H01L 23/051; H01L 24/33; H01L 21/565; H01L 21/6715;
(Continued)

(56) References Cited

U.S. PATENT DOCUMENTS 5,585,195 A * 12/1996 Shimada ............. H01L 21/4821
 205/125
5,677,570 A * 10/1997 Kondoh ............ H01L 23/49503
 257/690

(Continued)

FOREIGN PATENT DOCUMENTS

JP 9-102580 A 4/1997
JP 2002-170911 A 6/2002
(Continued)

OTHER PUBLICATIONS

Communication dated Nov. 28, 2017 from the Japanese Patent Office in counterpart Application No. 2017-512119.
(Continued)

*Primary Examiner* — Marc Anthony Armand
*Assistant Examiner* — Sue Tang
(74) *Attorney, Agent, or Firm* — Sughrue Mion, PLLC; Richard C. Turner

(57) ABSTRACT

In a semiconductor device, a thinly-molded portion covering a whole of a heat dissipating surface portion of a lead frame and a die pad space filled portion are integrally molded from a second mold resin, because of which adhesion between the thinly-molded portion and lead frame improves owing to the die pad space filled portion adhering to a side surface of the lead frame. Also, as the thinly-molded portion is partially thicker owing to the die pad space filled portion, strength of the thinly-molded portion increases, and a deficiency or cracking is unlikely to occur.

13 Claims, 8 Drawing Sheets

(51) Int. Cl.

| | | |
|---|---|---|
| *H01L 23/31* | (2006.01) | |
| *H01L 25/18* | (2006.01) | |
| *H01L 25/16* | (2006.01) | |
| *H01L 23/36* | (2006.01) | |
| *H01L 23/495* | (2006.01) | |
| *H01L 23/498* | (2006.01) | |
| *H01L 21/56* | (2006.01) | |

(52) U.S. Cl.
CPC .......... *H01L 23/31* (2013.01); *H01L 23/3135* (2013.01); *H01L 23/3142* (2013.01); *H01L 23/36* (2013.01); *H01L 23/49524* (2013.01); *H01L 23/49562* (2013.01); *H01L 23/49861* (2013.01); *H01L 25/165* (2013.01); *H01L 25/18* (2013.01); *H01L 23/49548* (2013.01); *H01L 23/49589* (2013.01); *H01L 2224/371* (2013.01); *H01L 2224/37147* (2013.01); *H01L 2224/37599* (2013.01); *H01L 2224/40245* (2013.01); *H01L 2224/48091* (2013.01); *H01L 2224/48247* (2013.01); *H01L 2224/73265* (2013.01); *H01L 2924/181* (2013.01)

(58) Field of Classification Search
CPC ....... H01L 21/4846; H01L 2924/19105; H01L 2224/32245; H01L 2224/40; H01L 23/4334; H01L 23/31; H01L 23/29; H01L 25/165
USPC .......................................................... 237/675
See application file for complete search history.

(56) References Cited

U.S. PATENT DOCUMENTS

| | | |
|---|---|---|
| 2002/0096759 A1 | 7/2002 | Hirano et al. |
| 2002/0149090 A1 | 10/2002 | Ikenaga et al. |
| 2002/0153596 A1 | 10/2002 | Tsubosaki et al. |
| 2003/0073265 A1* | 4/2003 | Hu ................. H01L 21/565 438/123 |
| 2008/0185697 A1 | 8/2008 | Chiou et al. |
| 2012/0018772 A1* | 1/2012 | Nishijima ............ H01L 33/486 257/99 |
| 2012/0021568 A1* | 1/2012 | Mino .................... H01L 21/565 438/127 |
| 2012/0326289 A1* | 12/2012 | Minamio ............. H01L 21/565 257/676 |
| 2015/0259589 A1* | 9/2015 | Takagi ....................... C08J 5/00 428/480 |

FOREIGN PATENT DOCUMENTS

| | | |
|---|---|---|
| JP | 2002-299538 A | 10/2002 |
| JP | 2009-302526 A | 12/2009 |
| JP | 201219204 A | 1/2012 |
| JP | 5415823 B2 | 2/2014 |

OTHER PUBLICATIONS

International Search Report for PCT/JP2015/061574 dated Jun. 23, 2015 [PCT/ISA/210].
Communication dated Oct. 8, 2018, from European Patent Office in counterpart application No. 15889173.9.

* cited by examiner

# SEMICONDUCTOR DEVICE

CROSS REFERENCE TO RELATED APPLICATIONS

This application is a National Stage of International Application No. PCT/JP2015/061574, filed on Apr. 15, 2015, the contents of all of which are incorporated herein by reference in their entirety.

TECHNICAL FIELD

The present invention relates to a mold resin type of semiconductor device, and in particular, relates to a semiconductor device such that the whole thereof is sealed with mold resin.

BACKGROUND ART

A power semiconductor device is such that a semiconductor element such as an IGBT (insulated gate bipolar transistor), MOSFET (metal-oxide-semiconductor field-effect transistor), IC chip, or LSI chip is die-bonded to an external terminal lead frame, after which an electrode of the semiconductor element and the external terminal are electrically connected by a wire or inner lead, and an input and output of signals from and to the exterior is carried out.

Also, a mold resin type of semiconductor device is such that a surface on a side of the lead frame on which the semiconductor element is mounted (a mounting surface), and a heat dissipating surface on a side opposite the mounting surface, are sealed by mold resin in a molding process. As a power semiconductor device includes a high-heat generating element in an interior thereof, high heat dissipation is required of the mold resin. For example, a semiconductor device presented in Patent Document 1 is such that the mounting surface of the lead frame is sealed by a low-stress resin used as a general integrated circuit mold resin, while the heat dissipating surface is sealed by a high-heat dissipating resin with thermal conductivity of 4 to 10 W/m·K.

Meanwhile, when sealing using two kinds of resin—a high-heat dissipating resin and a low-stress resin—as in Patent Document 1, there is a problem in that adhesion between the two resins is poor. In Patent Document 1, as a method of causing the high-heat dissipating resin and low-stress resin to adhere sufficiently, an outer peripheral end portion of the high-heat dissipating resin covering the heat dissipating surface of the lead frame is positioned inward of an outer peripheral end portion of the lead frame, and the high-heat dissipating resin in a semi-cured state is covered by the low-stress resin.

CITATION LIST

Patent Literature

PTL 1: Japanese Patent No. 5,415,823

SUMMARY OF INVENTION

Technical Problem

When using two kinds of resin, as in Patent Document 1, a mold resin having a large amount of filler and high viscosity is used as the high-heat dissipating resin. Because of this, resin fluidity is poor when molding using a transfer method, and the resin has difficulty in wetting the low-stress resin and lead frame. As a result of this, adhesion of the molded high-heat dissipating resin to the low-stress resin and lead frame is low, stress acts on an interface between the two kinds of mold resin, or on an interface between the lead frame and high-heat dissipating resin, when ejecting from a molding die, and an initial detachment may occur at these interfaces immediately after transfer molding.

Also, resin remaining in a gate, which is a path taken by resin inside a die used in transfer molding, is called runner, but immediately after a semiconductor device is removed from the die after transfer molding, a gate break that cuts the runner and semiconductor device apart is implemented, and a gate break mark remains on the semiconductor device. When implementing a gate break, a force that distorts the lead frame is applied, and a vicinity of the gate break mark is a place in which resin with high viscosity flows and adhesion with the lead frame is inferior to that in other places, because of which an initial detachment is liable to occur in the vicinity of the gate break mark. Also, even when there is no initial detachment, detachment is liable to occur at an interface between the two kinds of mold resin in the vicinity of the gate break mark, or at an interface between the lead frame and mold resin, due to repeated thermal stress in the usage environment.

Also, the mold resin on the heat dissipating surface side is desirably formed thinly in order to improve heat dissipation, but as a cavity portion of the die becomes narrow due to a reduction in thickness, fluidity of the resin inside the die becomes still poorer, and adhesion between the lead frame and resin decreases. Furthermore, there is a problem in that creepage distance becomes shorter due to a reduction in thickness, and insulation decreases, and a problem in that a deficiency due to a decrease in strength occurs when implementing a gate break. Because of these problems, compression molding using a die that does not have a gate portion is employed for molding a high-heat dissipating resin with high viscosity in Patent Document 1.

The invention, having been contrived in consideration of the heretofore described situation, has an object of providing a semiconductor device in which two kinds of mold resin are used, adhesion between the two kinds of mold resin or adhesion between a lead frame and mold resin is improved, detachment or deficiency of a thinly molded portion of a mold resin on a heat dissipating surface side is unlikely to occur even in a case of transfer molding in a die having a gate portion, and the semiconductor device has excellent heat dissipation and insulation.

Solution to Problem

A semiconductor device according to the invention includes a semiconductor element mounted in a mounting portion of a lead frame, a first mold resin that seals the mounting portion, and a second mold resin that seals a heat dissipating portion of the lead frame opposing the mounting portion, wherein a thinly-molded portion covering the heat dissipating portion of the lead frame and a lead frame space filled portion disposed in at least one portion of two separate regions of the lead frame are integrally molded from the second mold resin.

Advantageous Effects of Invention

According to the invention, a thinly-molded portion covering a heat dissipating portion of a lead frame and a lead frame space filled portion are integrally molded from a second mold resin, because of which adhesion between the thinly-molded portion and lead frame improves owing to the lead frame space filled portion adhering to a side surface of the lead frame. Also, as the thinly-molded portion is partially thicker owing to the lead frame space filled portion, strength of the thinly-molded portion increases. Because of this, detachment or deficiency of the thinly molded portion is unlikely to occur even in a case of the thinly-molded portion being transfer molded in a die having a gate, and a semiconductor device with excellent heat dissipation and insulation is obtained.

Objects, characteristics, aspects, and advantages of the invention other than those heretofore described will become further apparent from the following detailed description of the invention, with reference to the drawings.

DESCRIPTION OF EMBODIMENTS

First Embodiment

Figure 1:
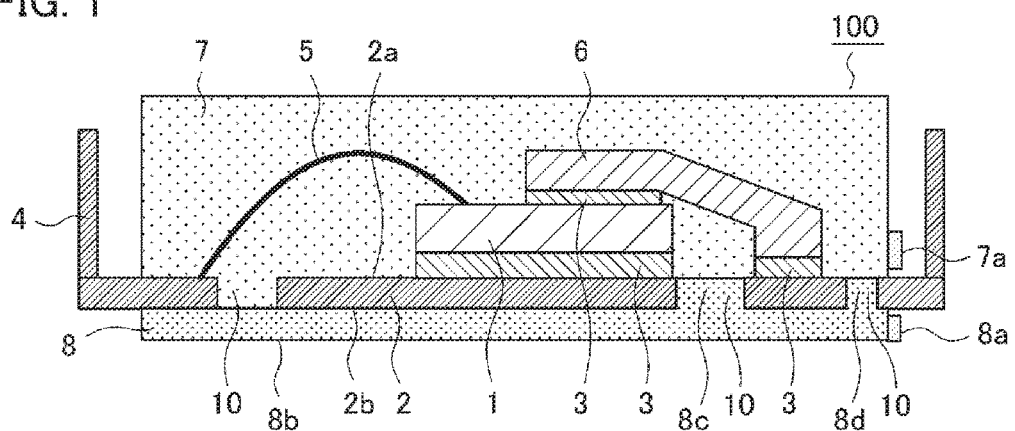
FIG. 1 is a sectional view showing a semiconductor device according to a first embodiment of the invention.
Figure 2:
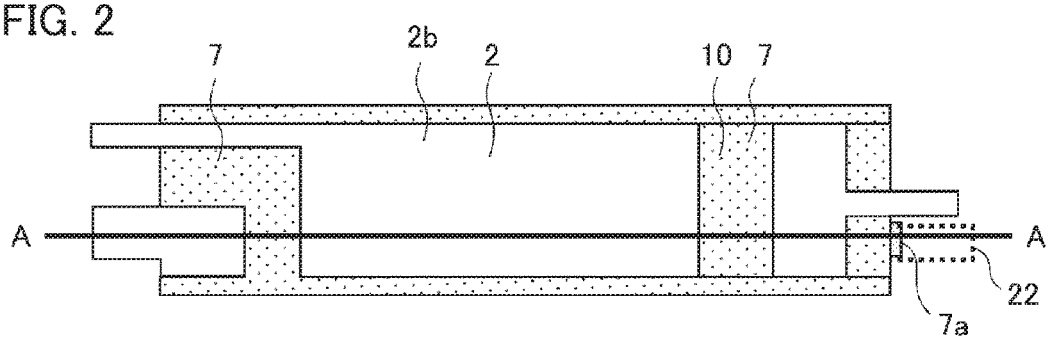
FIG. 2 is a plan view of the semiconductor device seen from a heat dissipating surface side after a first transfer molding step in the first embodiment of the invention.
Figure 3:
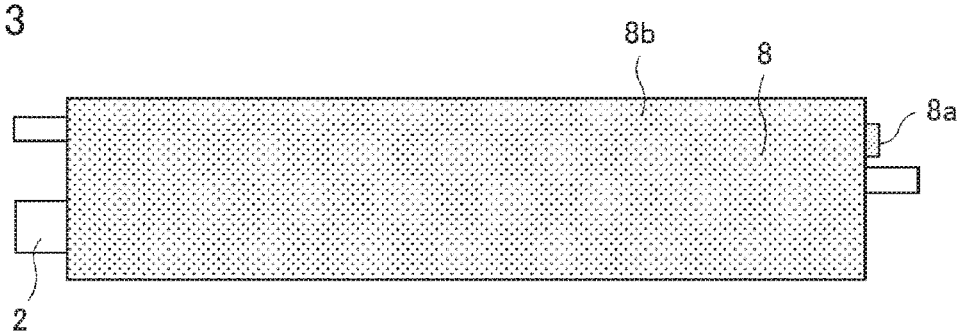
FIG. 3 is a plan view of the semiconductor device seen from the heat dissipating surface side after a second transfer molding step in the first embodiment of the invention.

Hereafter, based on the drawings, a description will be given of a semiconductor device according to a first embodiment of the invention. FIG. 1 is a sectional view showing a configuration of a mold resin type of semiconductor device according to the first embodiment, FIG. 2 is a plan view of the semiconductor device seen from a heat dissipating surface side after a first transfer molding step, and FIG. 3 is a plan view of the semiconductor device seen from the heat dissipating surface side after a second transfer molding step. Identical or corresponding portions in the drawings are allotted the same reference signs.

As shown in FIG. 1, a semiconductor device 100 according to the first embodiment is configured to include a semiconductor element 1, a lead frame 2, an external terminal 4, a wire 5, an inner lead 6, and the like. In the example shown in FIG. 1, a mounting portion of the lead frame 2 is such that the semiconductor element 1, which is an IGBT, MOSFET, IC chip, LSI chip, or the like, is mounted on an upper side surface (hereafter called a mounting surface 2a) of the lead frame 2 across a joining member 3 such as solder or silver. The lead frame 2 is a copper plate or copper alloy plate, and a surface thereof is coated with a metal plating (omitted from the drawings) of gold, silver, nickel, tin, or the like.

An electrode pad of the semiconductor element 1 is electrically connected to the external terminal 4 via the wire 5, which is connected by wire bonding, or the inner lead 6, which is fabricated of a copper plate or copper alloy plate material, and an input and output of signals from and to the exterior is carried out. The wire 5 and inner lead 6 are interchangeable. The wire 5 is formed of gold, silver, aluminum, copper, or the like, and a wire diameter is in the region of 20 μm to 500 μm.

The lead frame 2 is such that the mounting surface 2a, which is the mounting portion, is sealed by a first mold resin 7, while a heat dissipating portion of the lead frame 2 opposing the mounting surface 2a, which is a lower side surface (hereafter called a heat dissipating surface 2b) of the lead frame 2 in the example shown in FIG. 1, is sealed by a second mold resin 8. Also, a thinly-molded portion 8b of a thickness in the region of 0.02 mm to 0.3 mm that covers the heat dissipating surface 2b of the lead frame 2, and lead frame space filled portions (hereafter called die pad space filled portions 8c and 8d) disposed in at least one portion of a space between two separate regions of the lead frame 2 (hereafter called a die pad space 10), are molded integrally from the second mold resin 8. The thinly-molded portion 8b is joined to a heatsink made of copper or aluminum across a heat dissipating member such as grease.

The first mold resin 7 and second mold resin 8 are both thermosetting epoxy resins or the like. However, a high-heat dissipating resin with thermal conductivity higher than that of the first mold resin 7 is used for the second mold resin 8 on the heat dissipating surface 2b side. The thermal conductivity of the second mold resin 8 is 3 W/m·K to 12 W/m·K. A low-stress resin, which is a general integrated circuit mold resin, is used for the first mold resin 7 on the mounting surface 2a side.

In the example shown in FIG. 1, the die pad space filled portions 8c and 8d are disposed in the die pad space 10 in two places. By the die pad space filled portions 8c and 8d adhering to a side surface of the lead frame 2, an area over which the second mold resin 8 adheres to the lead frame 2 increases, and adhesion between the thinly-molded portion 8b and lead frame 2 improves.

Also, as the thinly-molded portion 8b is partially thicker owing to the die pad space filled portions 8c and 8d, the strength of the thinly-molded portion 8b increases, and deficiencies and cracking are unlikely to occur. Furthermore, heat dissipation improves owing to an increase in the area of adhesion between the lead frame 2, which forms a heat dissipation path, and the second mold resin 8, which is a high-heat dissipating resin. Although not shown in the drawing, heat dissipation improves further owing to the side surface of the lead frame 2 being covered with the second mold resin 8.

Figure 4:
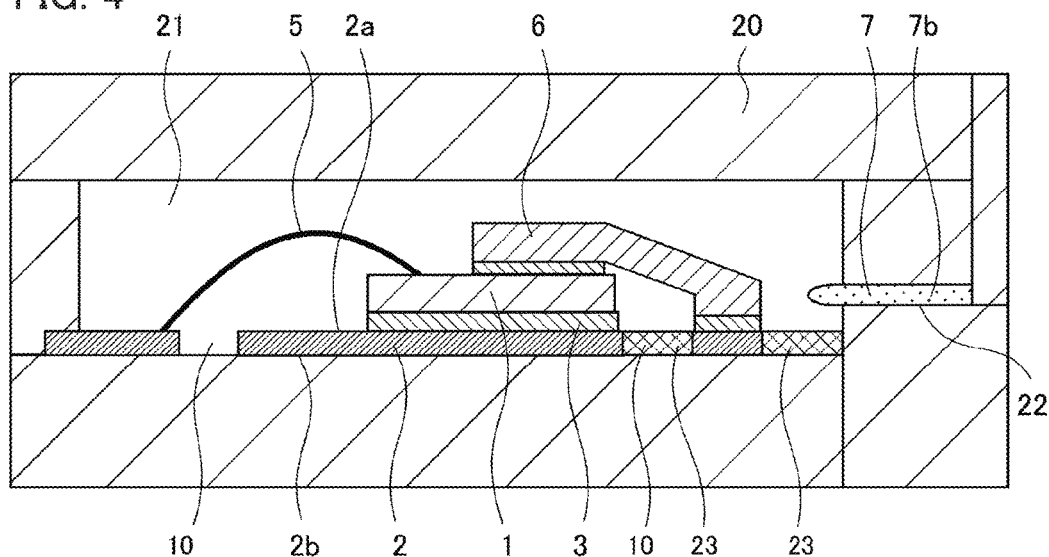
FIG. 4 is a sectional view showing the first transfer molding step of the semiconductor device according to the first embodiment of the invention.
Figure 5:
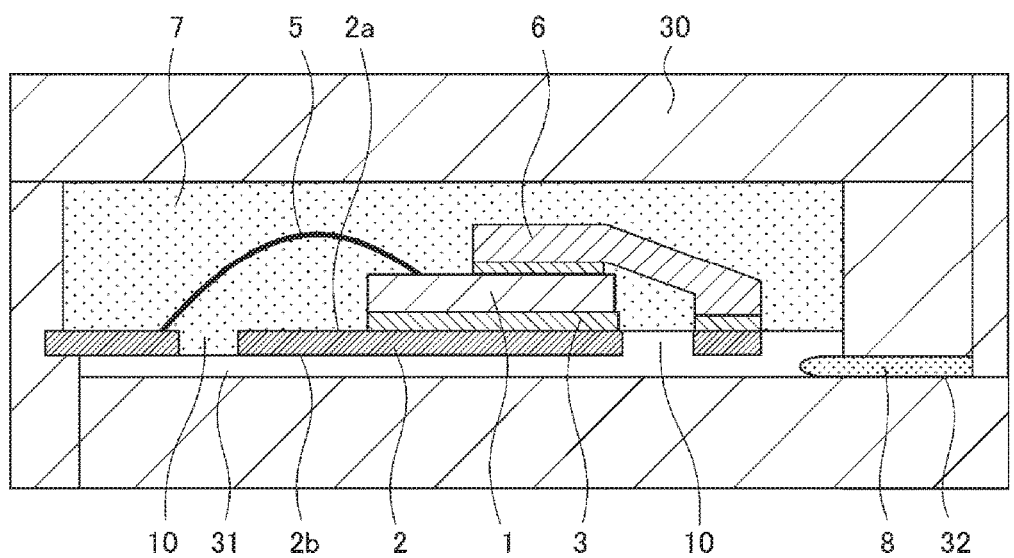
FIG. 5 is a sectional view showing the second transfer molding step of the semiconductor device according to the first embodiment of the invention.

Next, using FIG. 4 and FIG. 5, a description will be given of a molding process of the semiconductor device 100 according to the first embodiment. Manufacture of the semiconductor device 100 includes two transfer molding steps, with FIG. 4 showing a first transfer molding step and FIG. 5 showing a second transfer molding step. FIG. 4 and FIG. 5 are sectional views of a position indicated by A-A in FIG. 2.

In the first transfer molding step, the first mold resin 7 is melted by heat and pressure applied in a first molding die 20, passes through an upper gate 22, and is injected into a cavity 21 in which the lead frame 2 is installed, as shown in FIG. 4. The first mold resin 7 flows to the mounting surface 2a side of the lead frame 2, fills the cavity 21, and fills one portion of the die pad space 10.

In another die pad space 10, a pin 23 is inserted from the first molding die 20 in the first transfer molding step so that the die pad space 10 is not filled with the first mold resin 7. The first mold resin 7 remaining in an interior of the upper gate 22 of the first molding die 20 is called a runner 7b. Immediately after a molded item is removed from the first molding die 20 after the first transfer molding, a gate break step of cutting the runner 7b off of the molded item is implemented. After the gate break, an upper gate break mark 7a (refer to FIG. 1) remains on the semiconductor device 100.

Continuing, the second transfer molding step is implemented. In order to increase adhesion between the first mold resin 7 and second mold resin 8, UV processing or plasma processing may be implemented on the first mold resin 7 after the first transfer molding step. The lead frame 2, which has finished the previously described first transfer molding step and whose mounting surface 2a is sealed, is installed in an interior of a second molding die 30 used in the second transfer molding step, and the heat dissipating surface 2b side of the lead frame 2 forms a cavity 31, as shown in FIG. 5.

The second mold resin 8 is melted by heat and pressure applied in the second molding die 30, passes through a lower gate 32, and is injected into the cavity 31. The second mold resin 8 molds the thinly-molded portion 8b by flowing into the cavity 31, flows into the die pad space 10 not filled by the first mold resin 7, and molds the die pad space filled portions 8c and 8d.

After the second transfer molding step, a gate break step of cutting a runner off of a molded item is implemented immediately after the molded item is removed from the second molding die 30. After the gate break, a lower gate break mark 8a (refer to FIG. 1) remains on the semiconductor device 100.

A case in which the mounting surface 2a and heat dissipating surface 2b of the lead frame 2 are sealed simultaneously will be described as a comparative example of the first embodiment. When melted resin is injected onto both the mounting surface 2a and heat dissipating surface 2b in one transfer molding step, a difference between flow resistances of the two is large, and the resin flows to the thinly-molded portion 8b after a flow of resin to the mounting surface 2a side, which has lower resistance, is completed, because of which the thinly-molded portion 8b becomes a final filled portion. Resin such that curing is advanced and viscosity is high flows into the final filled portion, because of which it is difficult for the resin to flow uniformly to the thinly-molded portion 8b, which has high flow resistance. Also, as resin flows that have flowed from the mounting surface 2a side converge in the thinly-molded portion 8b, a weld line wherein strength and insulation are inferior is formed.

As opposed to this, in the first embodiment, resin is caused to flow separately to the upper gate 22 and lower gate 32 in two molding steps, because of which fluidity of the second mold resin 8 to the thinly-molded portion 8b improves. As a result of this, wetting of the first mold resin 7 and lead frame 2 by the second mold resin 8 becomes easier, and adhesion improves.

Figure 6:
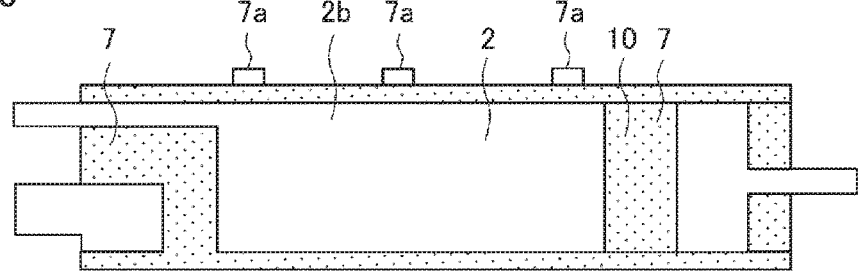
FIG. 6 is a plan view of another semiconductor device seen from the heat dissipating surface side after the first transfer molding step in the first embodiment of the invention.

In the first embodiment, the position of the upper gate break mark 7a (that is, the position of the upper gate 22 of the first molding die 20 used in the first transfer molding step), is not limited to the position shown in FIG. 2, and a number thereof not being limited to one, a multiple may exist. For example, there may be three upper gate break marks 7a, as shown in FIG. 6.

Figure 7:
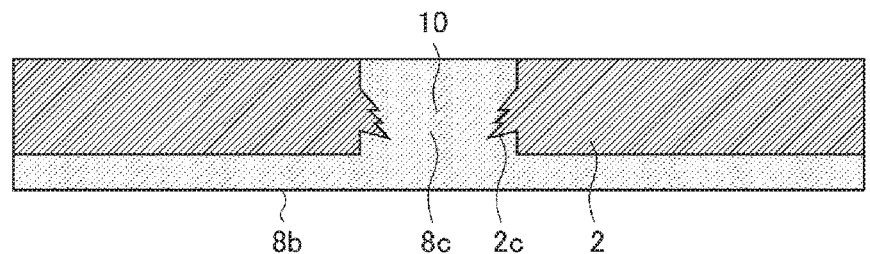
FIG. 7 is a partial sectional view showing the semiconductor device according to the first embodiment of the invention.

Also, one portion of a side surface of the lead frame 2 in which the die pad space filled portion 8c is disposed may have burr 2c, as shown in FIG. 7. By the burr 2c being formed by pressing on the side surface of the lead frame 2, the force of adhesion to the die pad space filled portion 8c improves further owing to an anchoring effect.

Also, in the first embodiment, the surface of the lead frame 2 is coated with a metal plating of gold, silver, nickel, tin, or the like, but there is also a case in which the surface is not coated. Also, in the first embodiment, the lead frame 2 used is of uniform thickness, but a lead frame whose thickness partially differs may also be used. In this case, however, the cost increases. Also, in the first embodiment, the heatsink is joined to the thinly-molded portion 8b across a heat dissipating member such as grease, but there is also a case in which no heat dissipating member is used (refer to a seventh embodiment).

Also, in the first embodiment, the surface on the side opposite the mounting surface 2a is taken to be a heat dissipating surface, but the mounting surface 2a may also have the same kind of heat dissipating property. For example, a high-heat dissipating resin with a thermal conductivity of 3 W/m·K to 12 W/m·K, the same as the second mold resin 8, may be used as the first mold resin 7. By a periphery of the semiconductor element 1, which is a high-heat emitting part, being sealed with a high-heat dissipating resin, heat is dissipated from the whole periphery of the semiconductor element 1, because of which heat dissipation improves.

According to the first embodiment, as heretofore described, the thinly-molded portion 8b covering the heat dissipating surface 2b of the lead frame 2 and the die pad space filled portions 8c and 8d are integrally molded from the second mold resin 8, because of which adhesion between the thinly-molded portion 8b and lead frame 2 improves owing to the die pad space filled portions 8c and 8d adhering to side surfaces of the lead frame 2. Also, as the thinly-molded portion 8b is partially thicker owing to the die pad space filled portions 8c and 8d, the strength of the thinly-molded portion 8b increases.

Also, the die pad space filled portion 8d is disposed adjacent to the lower gate break mark 8a, because of which an initial detachment of the thinly-molded portion 8b in the vicinity of the lower gate break mark 8a can be restricted. Furthermore, by the burr 2c being formed on the side surface of the lead frame 2 in which the die pad space filled portion 8c is disposed, adhesion improves further owing to an anchoring effect.

Because of these points, even in a case of the thinly-molded portion 8b covering the heat dissipating surface 2b of the lead frame 2 being transfer molded in a die having a gate, detachment or deficiency of the thinly-molded portion 8b is unlikely to occur, and the semiconductor device 100 with excellent heat dissipation and insulation is obtained.

Second Embodiment

Figure 8:
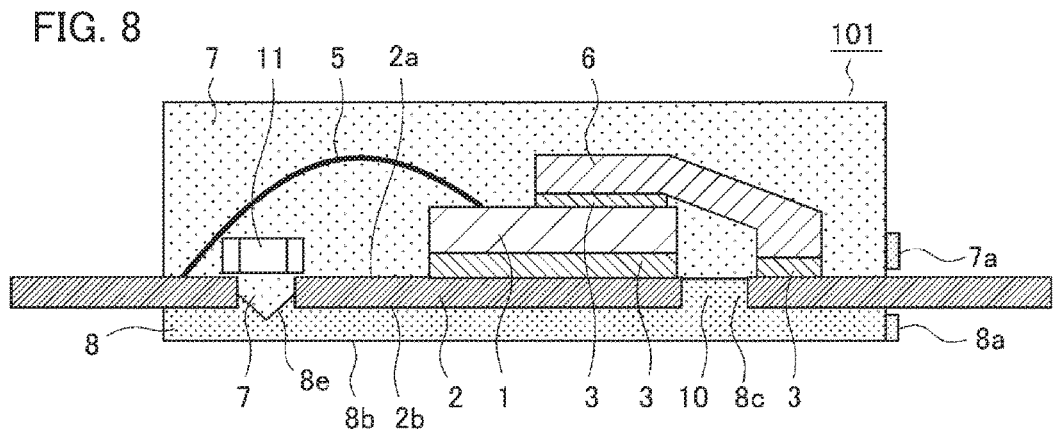
FIG. 8 is a sectional view showing a semiconductor device according to a second embodiment of the invention.

FIG. 8 is a sectional view showing a configuration of a semiconductor device according to a second embodiment of the invention. A semiconductor device 101 according to the second embodiment is a modification of the semiconductor device 100 according to the first embodiment, and as an overall configuration is the same, only differences will be described.

The semiconductor device 101 includes an electronic part (hereafter called a bridge-mounted part 11) bridge-mounted so as to straddle the die pad space 10 of the lead frame 2. A depression 8e is provided in the second mold resin 8 corresponding to a position directly below the bridge-mounted part 11, the mounting surface 2a of the lead frame 2 is sealed with the first mold resin 7, and the depression 8e is filled with the first mold resin 7.

Figure 9:
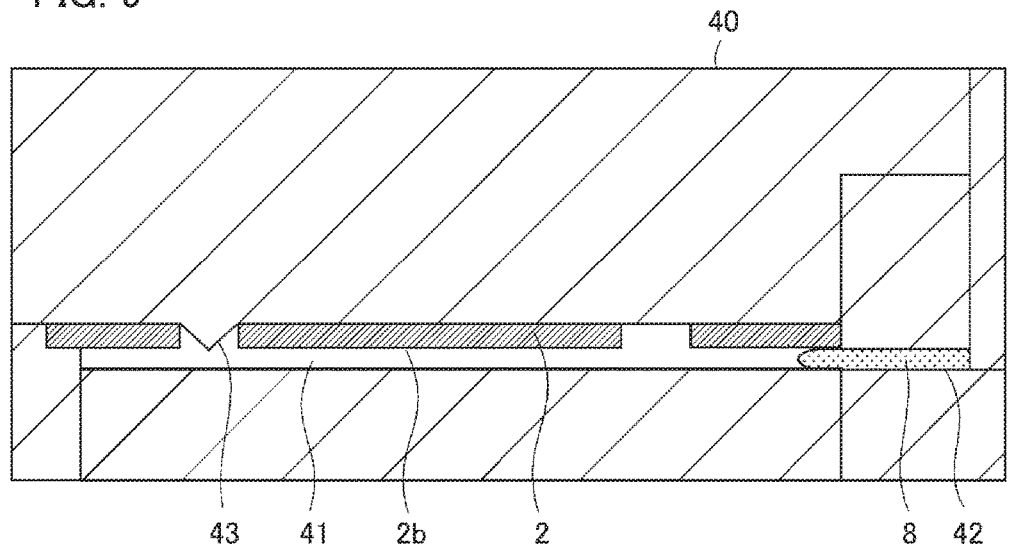
FIG. 9 is a sectional view showing a first transfer molding step of the semiconductor device according to the second embodiment of the invention.

Using FIG. 9, a description will be given of a manufacturing process of the semiconductor device 101 according to the second embodiment. Manufacture of the semiconductor device 101 includes two transfer molding steps, with FIG. 9 showing a first transfer molding step. In the second embodiment, the first transfer molding step is carried out before a part such as the semiconductor element 1 is mounted on the mounting surface 2a of the lead frame 2, and the thinly-molded portion 8b and die pad space filled portion 8c are molded from the second mold resin 8 on the heat dissipating surface 2b of the lead frame 2.

A third molding die 40 used in the first transfer molding step in the fourth embodiment has a protruding portion 43 in a position in the die pad space 10 in which the bridge-mounted part 11 is disposed, as shown in FIG. 9. In the first transfer molding step, the second mold resin 8 is melted by heat and pressure applied in the third molding die 40, passes through a lower gate 42, and is injected into a cavity 41 in which the lead frame 2 is installed. In the first transfer molding step, the thinly-molded portion 8b, which has the depression 8e in a position corresponding to directly below the bridge-mounted part 11, and the die pad space filled portion 8c are integrally molded from the second mold resin 8.

After the first transfer molding step, parts such as the semiconductor element 1 and bridge-mounted part 11 are mounted on the mounting surface 2a of the lead frame 2. Continuing, in the second transfer molding step, the melted first mold resin 7 flows over the mounting surface 2a of the lead frame 2, and fills the periphery of the bridge-mounted part 11 and the depression 8e directly below.

Figure 10:
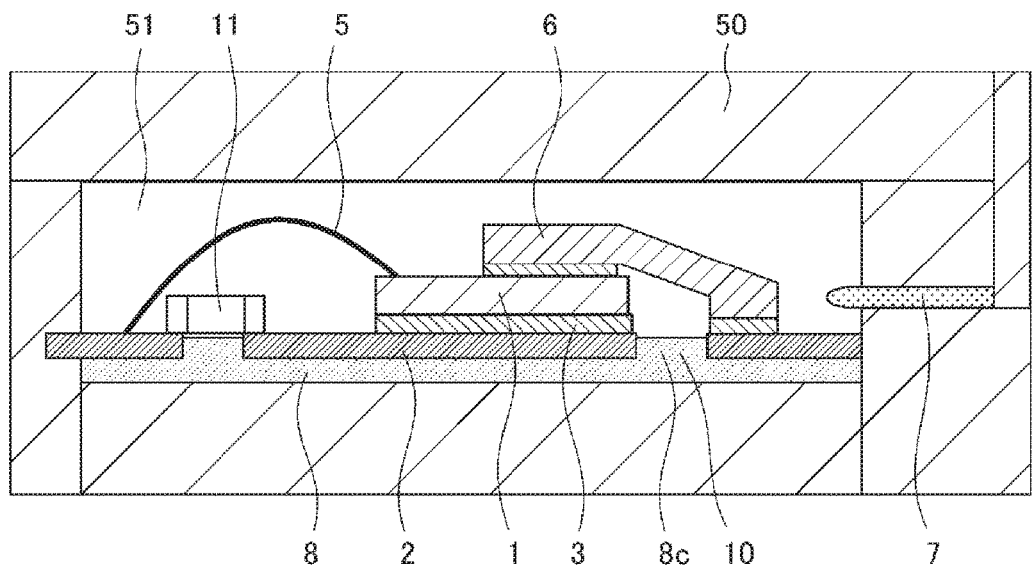
FIG. 10 is a sectional view showing a second transfer molding step of a semiconductor device that is a comparative example of the second embodiment of the invention.

As a comparative example of the second embodiment, FIG. 10 shows a second transfer molding step in a case in which there is no depression 8e in the second mold resin 8 directly below the bridge-mounted part 11. The first mold resin 7 injected into a cavity 51 of a molding die 50 shown in FIG. 10 flows over the mounting surface 2a of the lead frame 2, and fills the periphery of the bridge-mounted part 11.

However, as there is only an extremely narrow gap equivalent to a solder thickness of 50 μm to 100 μm directly below the bridge-mounted part 11, the flow resistance of the first mold resin 7 is high, and the first mold resin 7 flows with difficulty. Because of this, when the first mold resin 7 flows through the periphery of the bridge-mounted part 11, a region directly below the bridge-mounted part 11 remains as a cavity, and compaction pressure due to the first mold resin 7 is exerted from an upper surface, which is a factor in the bridge-mounted part 11 breaking.

As opposed to this, in the second embodiment, the depression 8e is provided in the second mold resin 8 directly below the bridge-mounted part 11, because of which the first mold resin 7 flows easily, and when the first mold resin 7 flows through the periphery of the bridge-mounted part 11, the first mold resin 7 can flow simultaneously to the upper surface and directly below the bridge-mounted part 11. Because of this, the region directly below the bridge-mounted part 11 is filled with the first mold resin 7, and breakage of the bridge-mounted part 11 caused by the compaction pressure of the first mold resin 7 can be reduced.

According to the second embodiment, in addition to the same advantages as in the first embodiment, breakage of the bridge-mounted part 11 can be reduced by the depression 8e being provided in the second mold resin 8 directly below the bridge-mounted part 11, and the depression 8e being filled with the first mold resin 7, whereby the highly reliable semiconductor device 101 is obtained.

Third Embodiment

Figure 11:
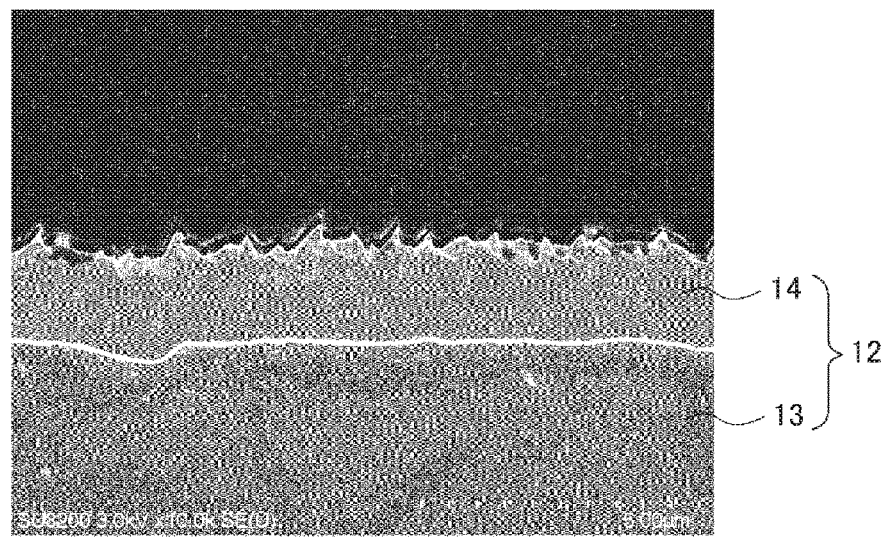
FIG. 11 is a diagram of a scanning electron micrograph showing a surface state of a lead frame of a semiconductor device according to a third embodiment of the invention.

FIG. 11 is a diagram of a scanning electron micrograph showing a surface state of a lead frame of a semiconductor device according to a third embodiment of the invention. As an overall configuration of the semiconductor device according to the third embodiment is the same as in the first embodiment, a description of each component will be omitted (refer to FIG. 1). Also, as a manufacturing method of the semiconductor device according to the third embodiment is the same as in the first embodiment, a description will be omitted.

The semiconductor device according to the third embodiment uses a roughened metal plating lead frame 12 instead of the lead frame 2 used in the first embodiment. The roughened metal plating lead frame 12 is such that a surface of a lead frame 13 made of copper or a copper alloy is coated with a roughened metal plating 14 of nickel, tin, silver, gold, or the like, with a surface roughness in the region of Ra 0.06 to 0.2.

According to the third embodiment, in addition to the same advantages as in the first embodiment, adhesion between the first mold resin 7 and second mold resin 8 improves owing to an anchoring effect of the roughened metal plating 14 because of using the roughened metal plating lead frame 12. Furthermore, a surface area of the roughened metal plating lead frame 12 is larger than that of the normal lead frame 2, because of which heat dissipation improves.

Fourth Embodiment

Figure 12:
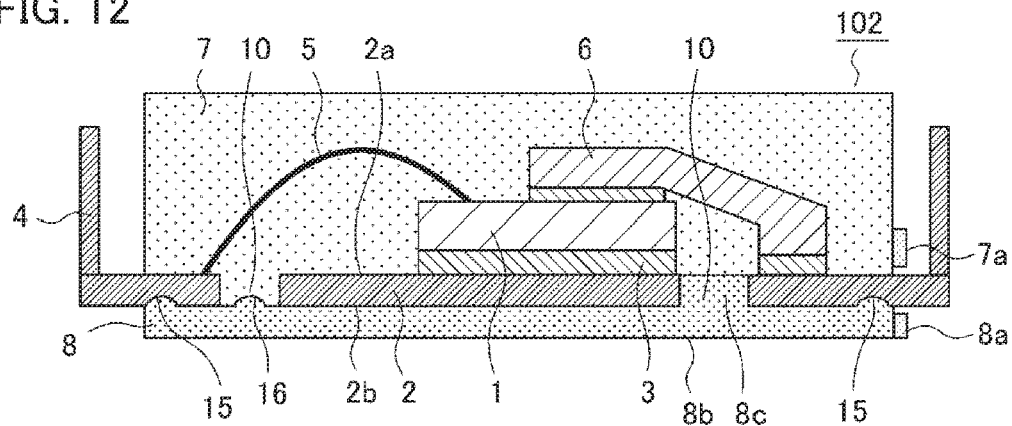
FIG. 12 is a sectional view showing a semiconductor device according to a fourth embodiment of the invention.

FIG. 12 is a sectional view showing a configuration of a semiconductor device according to a fourth embodiment of the invention. A semiconductor device 102 according to the fourth embodiment is a modification of the semiconductor device 100 according to the first embodiment, and as an overall configuration is the same, only differences will be described. Also, as a manufacturing method of the semiconductor device 102 according to the fourth embodiment is the same as in the first embodiment, a description will be omitted.

The lead frame 2 of the semiconductor device 102 is coated with a metal plating (omitted from the drawing), and has a scale form portion 15 that distorts a surface form of the metal plating into a scale form. In the example shown in FIG. 12, the scale form portion 15 is disposed in an outer peripheral portion of the heat dissipating surface 2b of the lead frame 2. Detachment of thinly-molded portion 8b of the second mold resin 8 from the lead frame 2 is restricted by an anchoring effect of the scale form portion 15.

Also, a depressed portion 16 is provided in the first mold resin 7 in the die pad space 10. The depressed portion 16 is formed, after the mounting surface 2a is sealed with the first mold resin 7 in a first transfer molding step, by the first mold resin 7 in the die pad space 10 being irradiated with a laser, thereby causing the first mold resin 7 to partially melt. A number and form of the depressed portion 16 are not particularly limited.

Also, a depressed portion may be provided in the second mold resin 8 disposed in the die pad space 10, that is, in the die pad space filled portion 8c. For example, when the thinly-molded portion 8b and die pad space filled portion 8c are molded from the second mold resin 8 in the first transfer molding step, as in the second embodiment, the die pad space filled portion 8c is irradiated with a laser, whereby a depressed portion can be formed. By a depressed portion being provided in this way in one of the resins in the die pad space 10, which forms a joint portion of the first mold resin 7 and second mold resin 8, adhesion between the first mold resin 7 and second mold resin 8 improves owing to an anchoring effect of the depressed portion.

Figure 13:
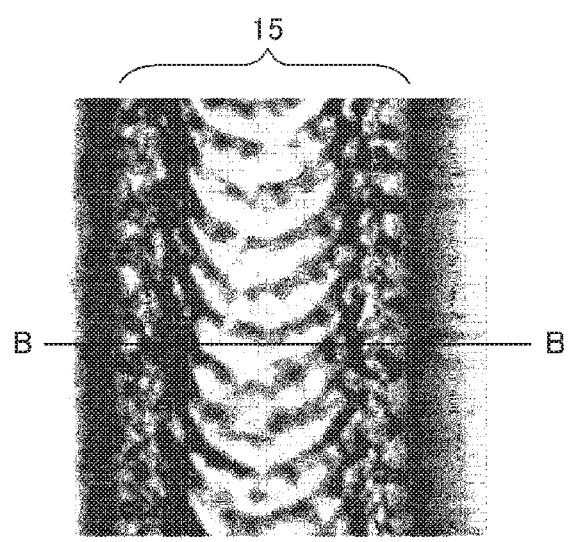
FIG. 13 is a diagram of a scanning electron micrograph showing an aspect of a scale form portion in the semiconductor device according to the fourth embodiment of the invention.
Figure 14:
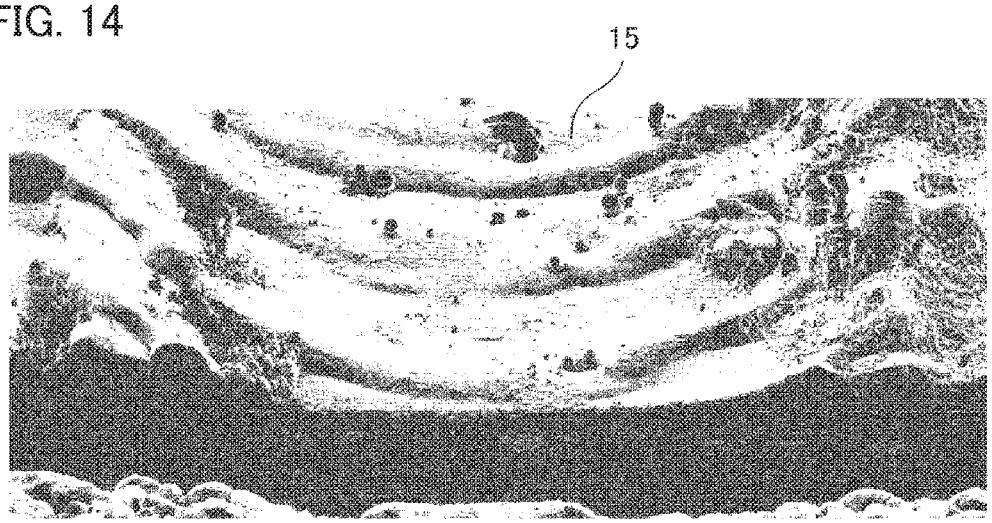
FIG. 14 is a diagram of a scanning electron micrograph showing an aspect of the scale form portion in the semiconductor device according to the fourth embodiment of the invention.

FIG. 13 and FIG. 14 are diagrams of a scanning electron micrograph showing an aspect of the scale form portion, wherein FIG. 14 is an upper perspective view of a cross-section indicated by B-B in FIG. 13. The scale form portion 15 is such that a metal plating coating the lead frame 2 is melted by spot irradiation using, for example, a laser being continuously carried out, and distorted into a scale form. The scale form portion 15 is such that scale form projections are continuously disposed, and both sides thereof are raised high.

As the scale form portion 15 is formed by laser irradiation, the scale form portion 15 can be selectively disposed in an arbitrary place in the lead frame 2, for example, a place in which stress is exerted, and an initial detachment is liable to occur, when the semiconductor device is ejected from the molding die or when a gate break is implemented, or a place in which adhesion with a mold resin is low. Also, width and height of the scale form portion 15 can be regulated by laser output, scanning speed, or the like. The width of the scale form portion 15 is desirably 60 μm or greater, and adhesion further improves owing to the width being increased in accordance with an area of a place in which the scale form portion 15 is disposed.

Figure 15:
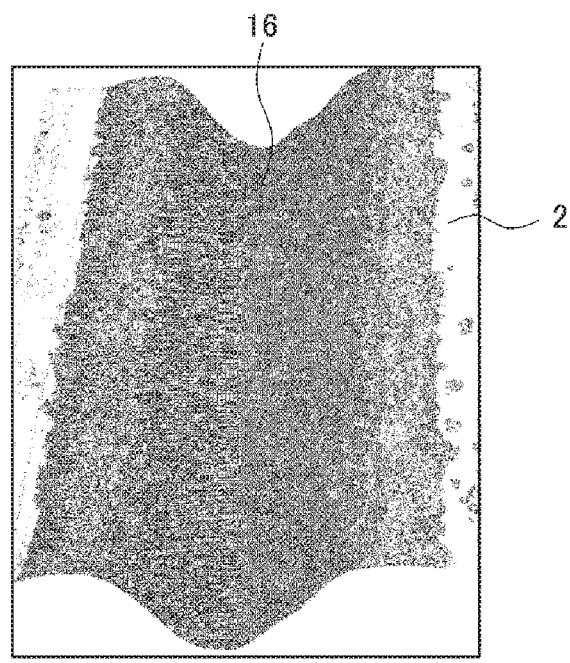
FIG. 15 is a diagram of a scanning electron micrograph showing an aspect of a depressed portion in the semiconductor device according to the fourth embodiment of the invention.

Also, FIG. 15 is a perspective view of a scanning electron micrograph showing an aspect of the depressed portion. The depressed portion 16 is such that resin is melted and depressed using laser irradiation. Width and depth of the depressed portion 16 can be regulated by laser output, scanning speed, or the like.

Figure 16:
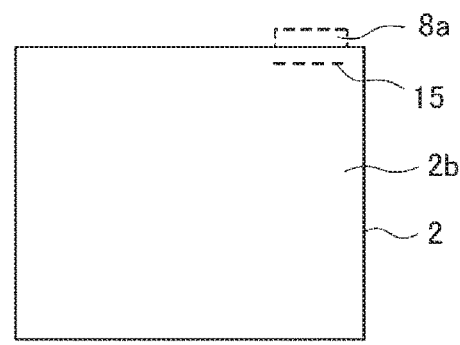
FIG. 16 is a diagram showing a disposition example of the scale form portion in the semiconductor device according to the fourth embodiment of the invention.

Scale form portion 15 disposition examples, and advantages thereof, will be described using FIG. 16 and FIG. 17. In the example shown in FIG. 16, the scale form portion 15 is disposed in the vicinity of the lower gate break mark 8a of the lead frame 2, that is, in a place adjacent to the lower gate 32 of the second molding die 30 (refer to FIG. 5). Because of this, adhesion between the lead frame 2 and second mold resin 8 in the vicinity of the lower gate break mark 8a, where an initial detachment is liable to occur, can be improved.

Figure 17:
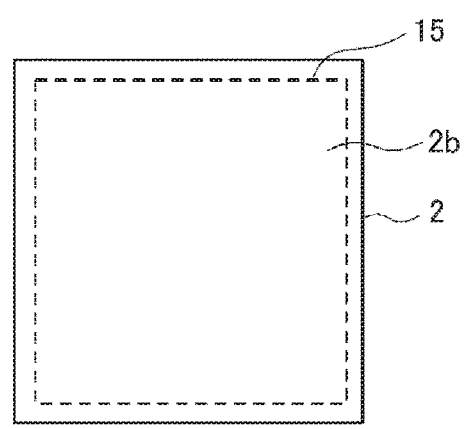
FIG. 17 is a diagram showing a disposition example of the scale form portion in the semiconductor device according to the fourth embodiment of the invention.

Also, in the example shown in FIG. 17, the scale form portion 15 is disposed in an outer peripheral portion of the heat dissipating surface 2b of the lead frame 2. Because of this, an initial detachment caused by stress when the semiconductor device 102 is ejected from the second molding die 30, and detachment caused by other stress from the exterior, can be restricted, and there is an advantage in that encroachment of moisture or a contaminant into an interior of the second mold resin 8 is prevented. Scale form portion 15 disposition examples not being limited to FIG. 16 and FIG. 17, the scale form portion 15 may also be provided in an outer peripheral portion of the mounting surface 2a of the lead frame 2, in a vicinity of the upper gate break mark 7a, or the like.

According to the fourth embodiment, in addition to the same advantages as in the first embodiment, adhesion between the lead frame 2 and the first mold resin 7 or second mold resin 8 improves owing to the scale form portion 15 being provided in an arbitrary place in the lead frame 2. Also, by the depressed portion 16 being provided in the first mold resin 7 or second mold resin 8 in the die pad space 10, adhesion between the first mold resin 7 and second mold resin 8 improves.

Fifth Embodiment

Figure 18:
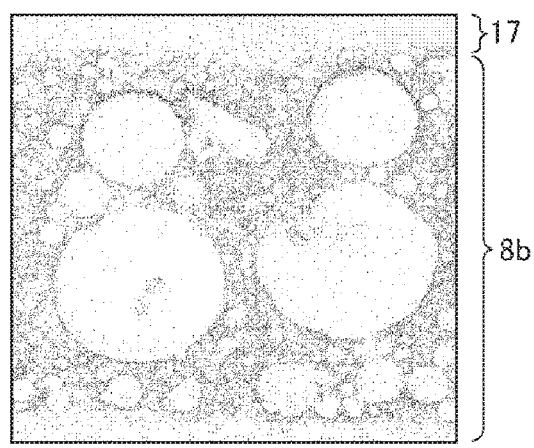
FIG. 18 is an enlarged sectional view showing a thinly-molded portion after a second transfer molding step in a semiconductor device according to a fifth embodiment of the invention.

FIG. 18 is an enlarged sectional view showing the thinly-molded portion after a second transfer molding step in a semiconductor device according to a fifth embodiment of the invention. As an overall configuration of the semiconductor device according to the fifth embodiment is the same as in the first embodiment, a description of each component will be omitted (refer to FIG. 1). Also, as a manufacturing method of the semiconductor device according to the fifth embodiment is the same as in the first embodiment, a description will be omitted.

The thinly-molded portion 8b after the second transfer molding step is such that a skin layer 17 caused by a flow of melted resin is formed on a surface in contact with the second molding die 30 (refer to FIG. 5) or lead frame 2. The skin layer 17 has little filler, a large amount of epoxy exists, and thermal conductivity is lower than in other portions. Therefore, in the fifth embodiment, the skin layer 17 on the surface of the thinly-molded portion 8*b* in contact with the heatsink is ground using laser processing or mechanical polishing, and thus removed, after the second transfer molding step.

According to the fifth embodiment, in addition to the same advantages as in the first embodiment, the skin layer 17 on the surface of the thinly-molded portion 8*b* is removed, because of which a semiconductor device with still more excellent heat dissipation is obtained.

Sixth Embodiment

Figure 19:
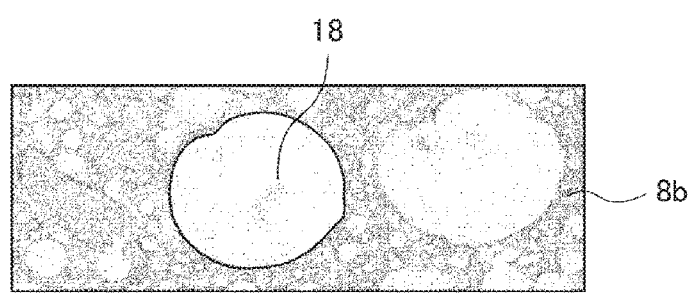
FIG. 19 is an enlarged sectional view showing the thinly-molded portion of a semiconductor device according to a sixth embodiment of the invention.

FIG. 19 is an enlarged sectional view showing the thinly-molded portion of a semiconductor device according to a sixth embodiment of the invention. As an overall configuration of the semiconductor device according to the sixth embodiment is the same as in the first embodiment, a description of each component will be omitted (refer to FIG. 1). Also, as a manufacturing method of the semiconductor device according to the sixth embodiment is the same as in the first embodiment, a description will be omitted.

In the sixth embodiment, a high-heat dissipating resin including a filler 18 with a thermal conductivity equal to or greater than that of silica or alumina and less than that of boron nitride is used as the second mold resin 8. Also, a filler cutting point (maximum filler diameter) of the filler 18 is taken to be 0.02 mm to 0.15 mm, and the thickness of the thinly-molded portion 8*b* is taken to be 0.022 mm to 0.3 mm, which is 1.1 times to 2 times the filler cutting point size.

According to the sixth embodiment, in addition to the same advantages as in the first embodiment, the heat dissipation of the thinly-molded portion 8*b* can be improved without using high-cost boron nitride as a filler, whereby a low-cost semiconductor device is obtained.

Seventh Embodiment

Figure 20:
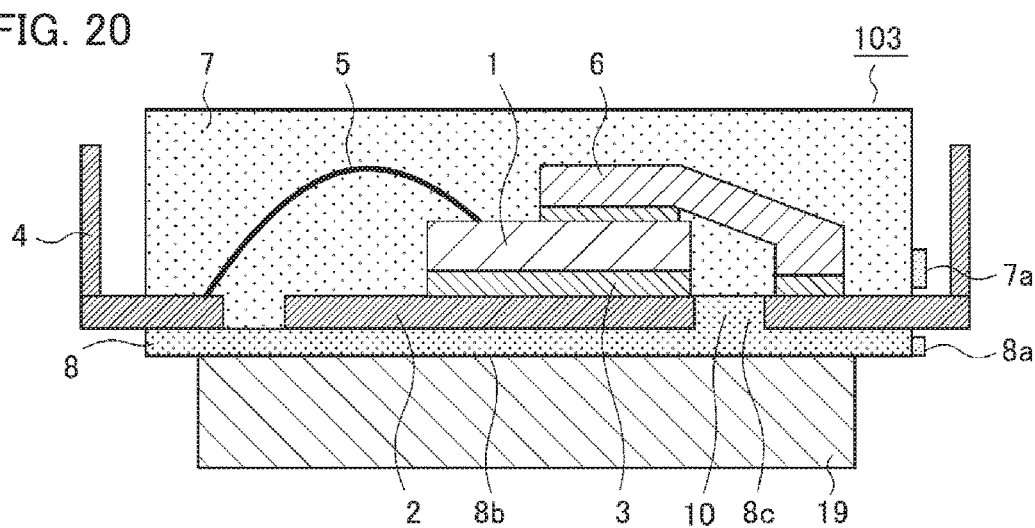
FIG. 20 is a sectional view showing a semiconductor device according to a seventh embodiment of the invention.
Figure 21:
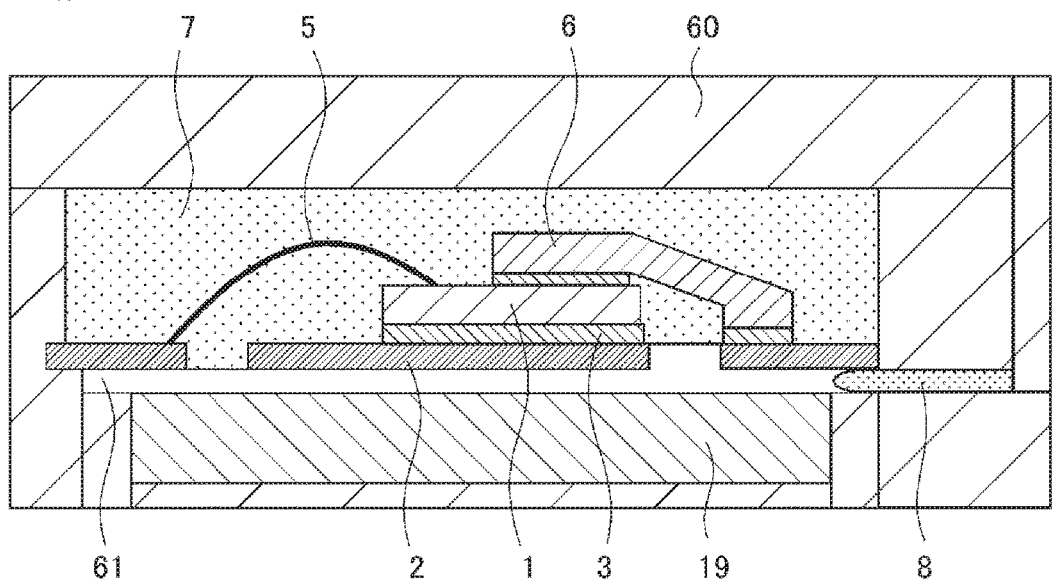
FIG. 21 is a sectional view showing a second transfer molding step of a semiconductor device according to the seventh embodiment of the invention.

FIG. 20 is a sectional view showing a semiconductor device according to a seventh embodiment of the invention, and FIG. 21 is a sectional view showing a second transfer molding step of the semiconductor device according to the seventh embodiment. A semiconductor device 103 according to the seventh embodiment is a modification of the semiconductor device 100 according to the first embodiment, and as an overall configuration is the same, only differences will be described.

The seventh embodiment is such that, in the second transfer molding step, a heatsink 19 is installed in an interior of a molding die 60, the heat diffusing surface of the lead frame 2 is sealed with the second mold resin 8, and the heatsink 19 is joined to the thinly-molded portion, as shown in FIG. 21. At this time, the second mold resin 8 before curing that flows to a cavity 61 corresponding to the thinly-molded portion doubles as an adhesive, because of which there is no need for a heat dissipating member such as grease for fixing the heatsink 19.

According to the seventh embodiment, in addition to the same advantages as in the first embodiment, heat dissipation improves further owing to the thinly-molded portion 8*b* being joined directly to the heatsink 19. Also, a step of joining the heatsink 19 to the thinly-molded portion 8*b* across a heat dissipating member such as grease after the second transfer molding step can be omitted.

In the first embodiment to seventh embodiment, the mounting surface 2*a* of the lead frame 2 is a mounting portion, and the heat dissipating surface 2*b* on the side opposite the mounting surface 2*a* is a heat dissipating portion, but as the mounting portion and heat dissipating portion may be the same surface of the lead frame 2, there is a case in which the lead frame 2 has a heat dissipating portion on both surfaces thereof. In this case too, the same advantage can be achieved by the mounting portion being covered with the first mold resin 7, and a thinly-molded portion covering the heat dissipating portion, and a die pad space filled portion, being integrally molded from the second mold resin 8.

The form, number, and disposition of each component of the semiconductor devices according to the first embodiment to seventh embodiment, for example, the semiconductor element 1, external terminal 4, wire 5, inner lead 6, and bridge-mounted part 11, not being particularly limited, are selected as appropriate in accordance with a required function. Also, the embodiments can be freely combined, and each embodiment can be modified or abbreviated as appropriate, without departing from the scope of the invention.

The invention claimed is:

1. A semiconductor device, comprising:
   a semiconductor element mounted in a mounting portion of a lead frame;
   a first mold resin that seals the mounting portion; and
   a second mold resin that seals a heat dissipating portion of the lead frame opposing the mounting portion, wherein
   the second mold resin comprises a thinly-molded portion covering the heat dissipating portion of the lead frame, and a lead frame space filled portion disposed in at least one portion of internal open regions between two separate regions of the lead frame distant from an outer edge of the lead frame, where the thinly molded portion and the lead frame space filled portion are integrally molded from the second mold resin, and
   at least one portion of the internal open region is filled with the first mold resin, and the first mold resin filling the internal open region has a depressed portion in an interface with the second mold resin.

2. The semiconductor device according to claim 1, wherein the second mold resin has a gate break mark, which is a trace of resin remaining in a gate of a molding die used in a transfer molding step, and the lead frame space filled portion is disposed adjacent to the gate break mark.

3. The semiconductor device according to claim 1, wherein there is burr on one portion of a side surface of the lead frame in which the lead frame space filled portion is disposed.

4. The semiconductor device according to claim 1, wherein a roughened metal plating lead frame coated with a metal plating, whose surface is roughened to surface roughness Ra having a value of 0.06 to 0.2, is used as the lead frame.

5. The semiconductor device according to claim 1, wherein the lead frame is covered with a metal plating, and has a scale form portion that causes a surface form of the metal plating to change into a scale form.

6. The semiconductor device according to claim 5, wherein the first mold resin has a gate break mark, which is a trace of resin remaining in a gate of a molding die used in a transfer molding step, and the scale form portion is disposed in a place adjacent to the gate break mark of the mounting portion of the lead frame.

7. The semiconductor device according to claim 5, wherein the second mold resin has the gate break mark, which is a trace of resin remaining in the gate of the molding die used in a transfer molding step, and the scale form portion is disposed in a place adjacent to the gate break mark of the heat dissipating portion of the lead frame.

8. The semiconductor device according to claim 5, wherein the scale form portion is disposed in an outer peripheral portion of either or both of the mounting portion and heat dissipating portion of the lead frame.

9. The semiconductor device according to claim 1, wherein a high-heat dissipating resin with a thermal conductivity higher than that of the first mold resin is used for the second mold resin.

10. The semiconductor device according to claim 1, wherein a high-heat dissipating resin with a thermal conductivity of 3 W/m·K to 12 W/m·K is used for the first mold resin and second mold resin.

11. The semiconductor device according to claim 1, wherein the second mold resin includes a filler with a maximum diameter of 0.02 mm to 0.15 mm, and a thickness of the thinly-molded portion is 0.022 mm to 0.3 mm.

12. The semiconductor device according to claim 1, wherein a heatsink is joined directly to the thinly-molded portion covering the heat dissipating portion of the lead frame.

13. A semiconductor device, comprising:
  a semiconductor element mounted in a mounting portion of a lead frame;
  a first mold resin that seals the mounting portion;
  a second mold resin that seals a heat dissipating portion of the lead frame opposing the mounting portion; and
  an electronic part bridge-mounted on the mounting portion so as to straddle two separate regions of the lead frame, wherein a depression is provided in the second mold resin corresponding to a position directly below the electronic part, the depression is filled with the first mold resin, and the second mold resin comprises a thinly-molded portion covering the heat dissipating portion of the lead frame and a lead frame space filled portion disposed in at least one portion between two separate regions of the lead frame, where the thinly molded portion and the lead frame space filled portion are integrally molded from the second mold resin.

* * * * *